(12) United States Patent
Choi et al.

(10) Patent No.: US 11,358,872 B2
(45) Date of Patent: Jun. 14, 2022

(54) POLYMER FOR TRANSFERRING GRAPHENE AND TRANSFER METHOD OF GRAPHENE USING THE SAME

(71) Applicant: Research & Business Foundation Sungkyunkwan University, Suwon-si (KR)

(72) Inventors: Jae Young Choi, Suwon-si (KR); Bum Jun Kim, Suwon-si (KR); Nasir Tuqeer, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 85 days.

(21) Appl. No.: 16/282,474

(22) Filed: Feb. 22, 2019

(65) Prior Publication Data
US 2019/0256357 A1    Aug. 22, 2019

(30) Foreign Application Priority Data
Feb. 22, 2018    (KR) .................... 10-2018-0021315

(51) Int. Cl.
*H01L 21/00*    (2006.01)
*C01B 32/194*    (2017.01)
(Continued)

(52) U.S. Cl.
CPC .......... *C01B 32/194* (2017.08); *C01B 32/184* (2017.08); *C08L 25/06* (2013.01);
(Continued)

(58) Field of Classification Search
CPC ..... C01B 32/194; C01B 32/184; C08L 25/06; H01L 21/00
See application file for complete search history.

(56) References Cited

U.S. PATENT DOCUMENTS

| 4,696,856 A | * | 9/1987 | Okada ............... B41M 5/10 106/31.28 |
| 5,489,646 A |   | 2/1996 | Tatman et al. |
| (Continued) | | | |

FOREIGN PATENT DOCUMENTS

| KR | 10-2013-0132105 A |   | 12/2013 |
| KR | 20130132105 A | * | 12/2013 |
| KR | 10-2015-0047048 A |   | 5/2015 |

OTHER PUBLICATIONS

KR 2013-0132105, Google Patents (Year: 2013).*
Korean Office Action dated Jul. 30, 2019 in counterpart Korean Patent Application No. 10-2018-0021315 (5 pages in Korean).

*Primary Examiner* — David P Turocy
*Assistant Examiner* — Mohammad Mayy
(74) *Attorney, Agent, or Firm* — NSIP Law

(57) ABSTRACT

The present disclosure relates to a polymer for transferring graphene, including: polystyrene; and a compound represented by the following Chemical Formula 1:

[Chemical Formula 1]

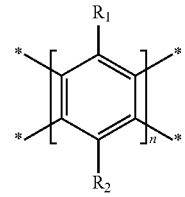

(in Chemical Formula 1,
$R_1$ and $R_2$ are each independently H, linear or branched $C_1$-$C_{20}$ alkyl, which can be substituted, and $C_6$-$C_{20}$ aryl, which can be substituted, and
(Continued)

the substitution is carried out with $C_1$-$C_6$ alkyl or $C_6$-$C_{20}$ aryl, and n is 1 to 10).

8 Claims, 18 Drawing Sheets

(51) Int. Cl.
 *C08L 25/06* (2006.01)
 *C01B 32/184* (2017.01)
 *C01B 32/188* (2017.01)
(52) U.S. Cl.
 CPC ............ *H01L 21/00* (2013.01); *C01B 32/188* (2017.08); *C01P 2002/82* (2013.01); *C01P 2004/02* (2013.01); *C01P 2004/03* (2013.01)

(56) References Cited

U.S. PATENT DOCUMENTS

| | | | | |
|---|---|---|---|---|
| 2007/0257091 | A1* | 11/2007 | Kuczynski | H01L 23/3675 228/49.1 |
| 2012/0267041 | A1* | 10/2012 | Woo | B82Y 40/00 156/230 |

* cited by examiner

POLYMER FOR TRANSFERRING GRAPHENE AND TRANSFER METHOD OF GRAPHENE USING THE SAME

CROSS-REFERENCE TO RELATED APPLICATION

This application claims the benefit of Korean Patent Application No. 10-2018-0021315 filed on Feb. 22, 2018, the disclosures of which are incorporated herein by reference.

TECHNICAL FIELD

The present disclosure relates to a polymer for transferring graphene and a transfer method of graphene using the same.

BACKGROUND

Graphene is a two-dimensional carbonaceous material and has an ultrathin film structure made up of a hexagonal honeycomb-shaped single layer of carbon atoms. Graphene is a material with the most excellent properties, such as strength, thermal conductivity, electron mobility, etc., among the existing materials and has attracted a lot of attention as a core material applicable to various fields such as display, secondary battery, solar battery, light emitting device, catalyst, and sensor.

Graphene is known as having a high electron mobility of from about 20,000 cm$^2$/Vs to about 50,000 cm$^2$/Vs. Above all, carbon nanotubes, which are similar to graphene, have a very low yield through a process including synthesis and purification. Therefore, even if carbon nanotubes are synthesized using a cheap material, final products are expensive, whereas graphite is very cheap. Further, single-walled carbon nanotubes have metallic or semiconductor properties depending on chirality and diameter. Even if single-walled carbon nanotubes have the same semiconductor properties, they are all different from each other in band gap. Therefore, in order to use a specific semiconductor property or metallic property of given single-walled carbon nanotubes, each of the single-walled carbon nanotubes needs to be separated, but such a process is known as being very difficult.

On the other hand, graphene has electrical properties that vary depending on crystal directionality of graphene of a given thickness, and, thus, a user can exhibit an electrical property into its selected direction. Therefore, graphene can be very effectively used in devices or carbon-based electromagnetic devices.

A metal catalyst has been mainly used to obtain large-area graphene. However, when graphene obtained using a metal catalyst is applied to an electronic and optical device, it may be contaminated, torn, or wrinkled while being transferred to a dielectric substrate and thus may cause degradation of the device. Particularly, after polymers such as PDMS and PMMA used for transferring graphene to another substrate are transferred, residues such as a carboxyl group of the polymers may remain on graphene, which may cause degradation of graphene.

An example of the background technology of the present disclosure is Korean Patent Laid-open Publication No. 2013-0132105 which relates to a method of transferring graphene and a method of manufacturing a device using the same. However, according to the publication, when a polymer layer is removed after being transferred, an unwanted polymer material may remain on graphene.

SUMMARY

In view of the foregoing, the present disclosure provides a polymer for transferring graphene and a transfer method of graphene using the same.

However, problems to be solved by the present disclosure are not limited to the above-described problems. There may be other problems to be solved by the present disclosure.

According to a first aspect of the present disclosure, there is provided a polymer for transferring graphene, including: polystyrene; and a compound represented by the following Chemical Formula 1:

[Chemical Formula 1]

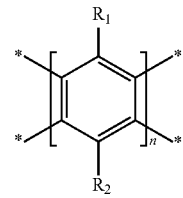

In Chemical Formula 1, $R_1$ and $R_2$ may be each independently H, linear or branched $C_1$-$C_{20}$ alkyl, which can be substituted, and $C_6$-$C_{20}$ aryl, which can be substituted, and the substitution may be carried out with $C_1$-$C_6$ alkyl or $C_6$-$C_{20}$ aryl and n may be 1 to 10, but may not be limited thereto.

According to an embodiment of the present disclosure, the aryl may include a material selected from the group consisting of phenyl, biphenyl, naphthalene, fluorene, anthracene, phenanthrene, pyrene, fluoranthene, chrysene, benzofluoranthene, perylene, quinoline, indenoanthracene, picene, indenophenanthrene, hydroanthracene, dibenzothiophene, dibenzofuran, and combinations thereof, but may not be limited thereto.

According to an embodiment of the present disclosure, the compound may include a compound containing a substituent and selected from the group consisting of biphenyl, naphthalene, fluorene, anthracene, phenanthrene, pyrene, fluoranthene, chrysene, benzofluoranthene, perylene, quinoline, indenoanthracene, picene, indenophenanthrene, hydroanthracene, dibenzothiophene, dibenzofuran, and combinations thereof, but may not be limited thereto.

According to an embodiment of the present disclosure, the substituent may include a methyl group, an ethyl group, a propyl group, a butyl group, a pentyl group, a hexyl group, and combinations thereof, but may not be limited thereto.

According to an embodiment of the present disclosure, the compound may include the following compound, but may not be limited thereto.

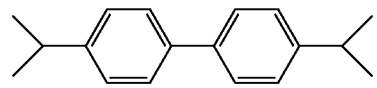 [SMILES: CC(C)c1ccc(-c2ccc(C(C)C)cc2)cc1]

According to an embodiment of the present disclosure, the polystyrene may be contained in the amount of from 1 part by weight to 10 parts by weight based on 100 parts by weight of the polymer for transferring graphene, but may not be limited thereto.

According to an embodiment of the present disclosure, the compound may be contained in the amount of from 5 parts by weight to 30 parts by weight based on 100 parts by weight of the polymer for transferring graphene, but may not be limited thereto.

According to an embodiment of the present disclosure, the use of the polymer for transferring graphene may make it possible to transfer the graphene on graphene without residues, but may not be limited thereto.

According to a second aspect of the present disclosure, there is provided a transfer method of graphene, including: forming graphene on a first substrate; forming the polymer for transferring graphene on the graphene; removing the first substrate; transferring the graphene, which is provided on the polymer for transferring graphene, onto a second substrate; and removing the polymer for transferring graphene.

According to an embodiment of the present disclosure, the forming of the polymer for transferring graphene may be performed by dissolving the polymer for transferring graphene in a solvent and coating the polymer for transferring graphene on the graphene, but may not be limited thereto.

According to an embodiment of the present disclosure, the solvent may include a solvent selected from the group consisting of toluene, heptane, carbon tetrachloride, benzene, xylene, N-methylpyrrolidone, tetrahydrofuran, nitrobenzene, N,N-dimethylformamide, dimethylsulfoxide, diethylcarbonate, benzyl acetate, dimethyl glutarate, ethyl acetoacetate, isobutyl isobutanoate, isobutyl acetate, metacresol, and combinations thereof, but may not be limited thereto.

According to an embodiment of the present disclosure, the first substrate and the second substrate may contain each independently a material selected from the group consisting of a metal substrate, a plastic substrate, a glass substrate, a silicon substrate, a sapphire substrate, a nitride substrate, a conductive substrate, and combinations thereof, but may not be limited thereto.

According to an embodiment of the present disclosure, the coating may be performed by a coating method selected from the group consisting of spin coating, spray coating, doctor blade coating, screen printing, dip coating, casting, Langmuir-Blodgett (LB) deposition, ink-jet printing, nozzle printing, slot die coating, gravure printing, and combinations thereof, but may not be limited thereto.

According to an embodiment of the present disclosure, the forming of the graphene on the first substrate may be performed by performing a heat treatment with a carbon source being supplied onto the first substrate to grow the graphene, but may not be limited thereto.

According to an embodiment of the present disclosure, the carbon source may contain a carbon-containing compound having 1 to 7 carbon atoms, but may not be limited thereto.

According to an embodiment of the present disclosure, the carbon source may include a material selected from the group consisting of methane, ethane, ethylene, carbon monoxide, ethanol, acetylene, propane, propylene, butane, butadiene, pentane, pentene, cyclopentadiene, hexane, cyclohexane, benzene, toluene, and combinations thereof, but may not be limited thereto.

The above-described aspects are provided by way of illustration only and should not be construed as liming the present disclosure. Besides the above-described embodiments, there may be additional embodiments described in the accompanying drawings and the detailed description.

According to the above-described aspects of the present disclosure, a polymer for transferring graphene according to the present disclosure is used as a support layer, and, thus, when graphene is transferred to another substrate, no residue remains on the graphene. Therefore, the graphene can retain its unique properties.

Specifically, the polymer for transferring graphene according to the present disclosure does not contain a functional group such as a carboxyl group, a hydroxy group, and the like and thus does not cause bonding between graphene and the functional group. Therefore, while graphene is transferred, no residue difficult to remove remains. Further, the polymer for transferring graphene contains an aryl group including a double bond and the aryl group can form a pi-pi bond with graphene. Therefore, if the polymer for transferring graphene is used as a support layer for transferring graphene, it is possible to minimize defects which can occur in the graphene while the graphene and the polymer for transferring graphene are separated.

Particularly, a specific compound is added as a softener, and, thus, the flexibility of the polymer for transferring graphene can be increased. Therefore, when graphene is transferred, no crack occurs on the surface of the graphene, and the graphene can be transferred onto a flexible substrate without any residue.

Further, the use of the polymer for transferring graphene according to the present disclosure makes it possible to transfer large-area graphene at low cost.

Furthermore, various transfer conditions can be easily controlled or optimized for each type of substrate.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
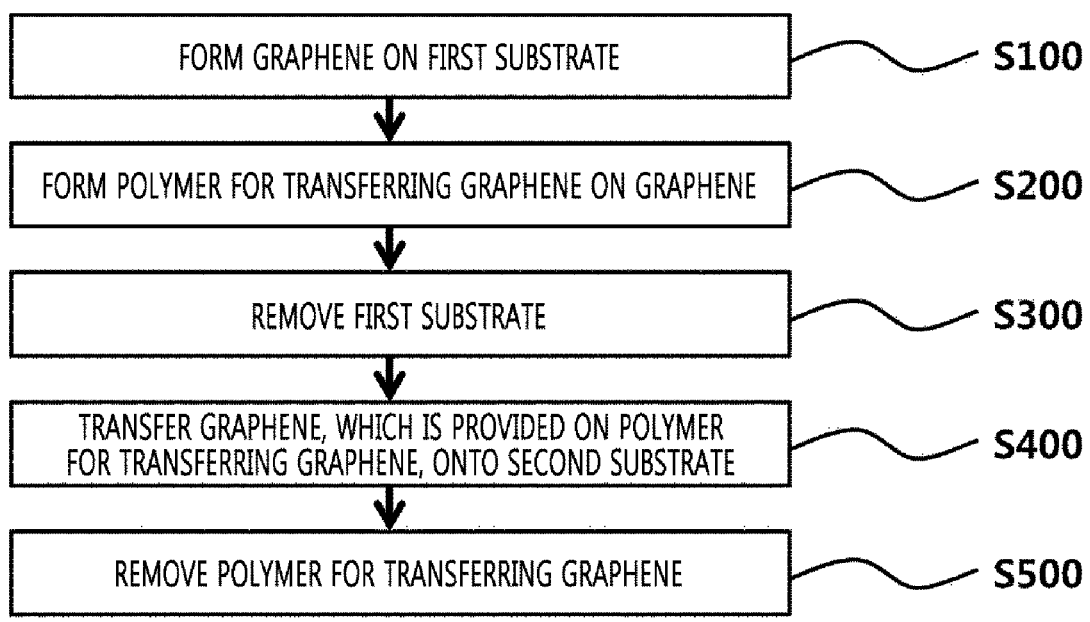
FIG. 1 is a flowchart showing a transfer method of graphene according to an embodiment of the present disclosure.

Hereinafter, embodiments of the present disclosure will be described in detail with reference to the accompanying drawings so that the present disclosure may be readily implemented by those skilled in the art.

However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the terms "on", "above", "on an upper end", "below", "under", and "on a lower end" that are used to designate a position of one element with respect to another element include both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Through the whole document, the term "aryl" refers to a $C_{6-30}$ aromatic cyclic hydrocarbon group, for example, aromatic rings such as phenyl, naphthyl, biphenyl, terphenyl, fluorene, phenanthrenyl, triphenylenyl, pherylenyl, crysenyl, fluoranthenyl, benzofluorenyl, benzotriphenylenyl, benzocrysenyl, anthracenyl, stilbenyl, pyrenyl, and the like.

Through the whole document, the term "alkyl" may include linear or branched saturated or unsaturated $C_{1-6}$ alkyl, and may include, for example, methyl, ethyl, propyl, butyl, pentyl, hexyl, or all the possible isomers thereof, but may not be limited thereto.

Hereafter, a polymer for transferring graphene and a transfer method of graphene using the same according to the present disclosure will be described in detail with reference to embodiments, examples, and the accompanying drawings. However, the present disclosure may not be limited to the following embodiments, examples, and drawings.

A first aspect of the present disclosure relates to a polymer for transferring graphene, including: polystyrene; and a compound represented by the following Chemical Formula 1:

[Chemical Formula 1]

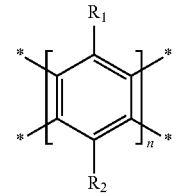

In Chemical Formula 1, $R_1$ and $R_2$ may be each independently H, linear or branched $C_1$-$C_{20}$ alkyl, which can be substituted, and $C_6$-$C_{20}$ aryl, which can be substituted, and the substitution may be carried out with $C_1$-$C_6$ alkyl or $C_6$-$C_{20}$ aryl and n may be 1 to 10, but may not be limited thereto.

The compound represented by Chemical Formula 1 is added as a softener, and, thus, the flexibility of the polymer for transferring graphene can be increased. Therefore, when graphene is transferred, no crack occurs on the surface of the graphene, and the graphene can be transferred onto a flexible substrate without any residue.

According to an embodiment of the present disclosure, the aryl may include a material selected from the group consisting of phenyl, biphenyl, naphthalene, fluorene, anthracene, phenanthrene, pyrene, fluoranthene, chrysene, benzofluoranthene, perylene, quinoline, indenoanthracene, picene, indenophenanthrene, hydroanthracene, dibenzothiophene, dibenzofuran, and combinations thereof, but may not be limited thereto.

According to an embodiment of the present disclosure, the compound may include a compound containing a substituent and selected from the group consisting of biphenyl, naphthalene, fluorene, anthracene, phenanthrene, pyrene, fluoranthene, chrysene, benzofluoranthene, perylene, quinoline, indenoanthracene, picene, indenophenanthrene, hydroanthracene, dibenzothiophene, dibenzofuran, and combinations thereof, but may not be limited thereto.

According to an embodiment of the present disclosure, the substituent may include a methyl group, an ethyl group, a propyl group, a butyl group, a pentyl group, a hexyl group, and combinations thereof, but may not be limited thereto.

According to an embodiment of the present disclosure, the compound may include the following compound, but may not be limited thereto.

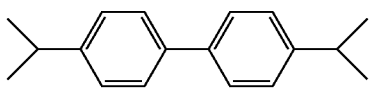 [SMILES: CC(C)c1ccc(-c2ccc(C(C)C)cc2)cc1]

According to an embodiment of the present disclosure, the polystyrene may be contained in the amount of from 1 part by weight to 10 parts by weight based on 100 parts by weight of the polymer for transferring graphene, but may not be limited thereto.

If the polystyrene is contained in the amount of 10 parts by weight or more based on 100 parts by weight of the polymer for transferring graphene, the flexibility of the polymer for transferring graphene may decrease.

According to an embodiment of the present disclosure, the compound may be contained in the amount of from 5 parts by weight to 30 parts by weight based on 100 parts by weight of the polymer for transferring graphene, but may not be limited thereto.

If the polystyrene is used as a polymer for transferring graphene, it does not leave a residue as compared with polymethyl methacrylate (PMMA) which has been conventionally used as a polymer for transfer. However, the polystyrene is insufficient in flexibility, and, thus, while or after graphene is transferred, cracks may occur on the surface of the graphene, which may cause degradation of the transferred graphene.

According to the present disclosure, the compound is added as a softener, and, thus, the flexibility of the polymer for transferring graphene can be increased. Therefore, when graphene is transferred, no crack occurs on the surface of the graphene, and the graphene can be transferred onto a flexible substrate without any residue.

Further, since the compound is added, no residue remains when graphene is transferred. Therefore, after the graphene is transferred, a post process such as a heat treatment is not needed.

The compound may be mixed uniformly with the polystyrene.

If the compound is contained in the amount of from 5 parts by weight or less based on 100 parts by weight of the polymer for transferring graphene, the flexibility of the polymer for transferring graphene may decrease, and if it is contained in the amount of from 30 parts by weight or more based on 100 parts by weight of the polymer for transferring graphene, the properties of the polymer for transferring graphene may be degraded.

According to an embodiment of the present disclosure, the use of the polymer for transferring graphene may make it possible to transfer the graphene on graphene without residues, but may not be limited thereto.

When the polymer for transferring graphene is used as a support layer to transfer graphene onto another substrate, no residue remains on the graphene. Therefore, the graphene can retain its unique properties.

Specifically, the polymer does not contain a functional group such as a carboxyl group, a hydroxy group, and the like and thus does not cause bonding between graphene and the functional group. Therefore, while graphene is transferred, no residue difficult to remove remains. Further, the polymer for transferring graphene contains an aryl group including a double bond and the aryl group can form a pi-pi bond with graphene. Therefore, if the polymer for transferring graphene is used as a support layer for transferring graphene, it is possible to minimize defects which can occur in the graphene while the graphene and the polymer for transferring graphene are separated.

Further, the use of the polymer for transferring graphene makes it possible to transfer large-area graphene at low cost.

According to a second aspect of the present disclosure, there is provided a transfer method of graphene, including: forming graphene on a first substrate; forming the polymer for transferring graphene on the graphene; removing the first substrate; transferring the graphene, which is provided on the polymer for transferring graphene, onto a second substrate; and removing the polymer for transferring graphene.

FIG. 1 is a flowchart showing a transfer method of graphene according to an embodiment of the present disclosure.

Firstly, graphene is formed on a first substrate (S100).

The first substrate may include a material selected from the group consisting of a metal substrate, a plastic substrate, a glass substrate, a silicon substrate, a sapphire substrate, a nitride substrate, a conductive substrate, and combinations thereof, but may not be limited thereto. Desirably, the first substrate may include a metal substrate.

The metal may include a metal selected from the group consisting of Cu, Ni, Sc, Ti, V, Cr, Mn, Fe, Co, Zn, Al, Ti, Si, Mg, Y, Zr, Nb, Mo, Tc, Ru, Rh, Pd, Ag, Cd, Hf, Ta, W, Re, Os, Ir, Pt, Au, Hg, Rf, and combinations thereof, but may not be limited thereto.

According to an embodiment of the present disclosure, the forming of the graphene on the first substrate may be performed by performing a heat treatment with a carbon source being supplied onto the first substrate to grow the graphene, but may not be limited thereto.

The forming of the graphene on the first substrate may be performed by chemical vapor deposition, but may not be limited thereto.

According to an embodiment of the present disclosure, the carbon source may contain a carbon-containing compound having 1 to 7 carbon atoms, but may not be limited thereto.

According to an embodiment of the present disclosure, the carbon source may include a material selected from the group consisting of methane, ethane, ethylene, carbon monoxide, ethanol, acetylene, propane, propylene, butane, butadiene, pentane, pentene, cyclopentadiene, hexane, cyclohexane, benzene, toluene, and combinations thereof, but may not be limited thereto.

The graphene on the first substrate may be epitaxially grown, but may not be limited thereto.

The heat treatment may be performed at a temperature of from 300° C. to 1700° C., but may not be limited thereto.

The chemical vapor deposition may further include supplying hydrogen before growing the graphene, but may not be limited thereto.

The chemical vapor deposition may further include cooling a product of the heat treatment, but may not be limited thereto.

Then, the polymer for transferring graphene is formed on the graphene (S200).

According to an embodiment of the present disclosure, the forming of the polymer for transferring graphene may be performed by dissolving the polymer for transferring graphene in a solvent and coating the polymer for transferring graphene on the graphene, but may not be limited thereto.

According to an embodiment of the present disclosure, the solvent may include a solvent selected from the group consisting of toluene, heptane, carbon tetrachloride, benzene, xylene, N-methylpyrrolidone, tetrahydrofuran, nitrobenzene, N,N-dimethylformamide, dimethylsulfoxide, diethylcarbonate, benzyl acetate, dimethyl glutarate, ethyl acetoacetate, isobutyl isobutanoate, isobutyl acetate, meta-cresol, and combinations thereof, but may not be limited thereto.

According to an embodiment of the present disclosure, the coating may be performed by a coating method selected from the group consisting of spin coating, spray coating, doctor blade coating, screen printing, dip coating, casting, Langmuir-Blodgett (LB) deposition, ink-jet printing, nozzle printing, slot die coating, gravure printing, and combinations thereof, but may not be limited thereto.

Then, the first substrate is removed (S300).

If the first substrate is a metal substrate, the metal substrate may be removed using a metal etchant, but may not be limited thereto. As the metal etchant, a chloride-based aqueous solution such as $FeCl_3$, APS (ammonium persulfate) or a sulfate-based aqueous solution may be used, but may not be limited thereto.

After the metal substrate is removed using the etchant, the etchant may be removed by washing with water several times, but may not be limited thereto.

Then, the graphene provided on the polymer for transferring graphene is transferred onto a second substrate (S400).

The second substrate may include a material selected from the group consisting of a metal substrate, a plastic substrate, a glass substrate, a silicon substrate, a sapphire substrate, a nitride substrate, a conductive substrate, and combinations thereof, but may not be limited thereto.

The plastic substrate may include a material selected from the group consisting of polycarbonate (PC), polyethersulfone (PES), polyethylene naphthalate (PEN), polyethylene terephthalate (PET), polystyrene (PS), polyimide (PI), polyethylene (PE), and combinations thereof, but may not be limited thereto.

The conductive substrate may include a material selected from the group consisting of indium tin oxide (ITO), fluorine tin oxide (FTO), $ZnO-Ga_2O_3$, $ZnO-Al_2O_3$, and combinations thereof, but may not be limited thereto.

According to an embodiment of the present disclosure, the first substrate and the second substrate may contain each independently a material selected from the group consisting of a metal substrate, a plastic substrate, a glass substrate, a silicon substrate, a sapphire substrate, a nitride substrate, a conductive substrate, and combinations thereof, but may not be limited thereto.

Annealing may be further performed after the graphene is transferred onto the second substrate, but may not be limited thereto.

The annealing may be performed at 40° C. to 100° C., but may not be limited thereto.

Then, the polymer for transferring graphene is removed (S500).

The polymer for transferring graphene may be removed by dissolving the polymer for transferring graphene in a solvent, but may not be limited thereto.

The solvent may include a solvent selected from the group consisting of toluene, heptane, carbon tetrachloride, benzene, xylene, N-methylpyrrolidone, tetrahydrofuran, nitrobenzene, N,N-dimethylformamide, dimethylsulfoxide, diethylcarbonate, benzyl acetate, dimethyl glutarate, ethyl acetoacetate, isobutyl isobutanoate, isobutyl acetate, meta-cresol, and combinations thereof, but may not be limited thereto.

Hereinafter, the present disclosure will be described in more detail with reference to examples. The following examples are provided only for explanation, but do not intend to limit the scope of the present disclosure.

Example 1

5 wt % polystyrene beads (average molecular weight of 192,000 MW, Sigma Aldrich) was dissolved in toluene at room temperature, and the polystyrene was completely dissolved with stirring for 30 minutes to prepare a polystyrene solution. 20 wt % 4,4'-diisopropylbiphenyl (DIPB) was added onto the polystyrene solution, and the 4,4'-diisopropylbiphenyl was completely dissolved with stirring for 30 minutes to prepare a solution of polymer for transferring graphene. The solution of polymer for transferring graphene was spin-coated on a copper foil to prepare a polymer for transferring graphene.

Example 2

Firstly, a copper foil (25 μm, 99.9%, Alfa Aesar) was sequentially washed with Ni etchant (CE-100) and distilled water and a nitrogen gas was used to remove moisture from the copper foil. The copper foil was put into a quartz tube and a heat treatment was performed with hydrogen (99.999%) at 1005° C. and then a high-purity methane gas (99.999%) was injected therein to grow graphene on the copper foil.

Then, the solution of polymer for transferring graphene as prepared in Example 1 was spin-coated on the copper foil on which the graphene was formed to form a polymer layer for transferring graphene.

Then, the polymer layer for transferring graphene was immersed in a copper etchant solution to remove the copper foil, and the remaining cooper etchant solution was removed by washing with distilled water three times.

After the graphene provided on the polymer layer for transferring graphene was transferred onto an $SiO_2$ substrate, it was annealed in a dry oven at a temperature of 80° C.

Then, the polymer layer for transferring graphene was removed using tetrahydrofuran and acetone to obtain graphene transferred on the $SiO_2$ substrate.

Comparative Example 1

Firstly, a copper foil (25 μm, 99.9%, Alfa Aesar) was sequentially washed with Ni etchant (CE-100) and distilled water and a nitrogen gas was used to remove moisture from the copper foil. The copper foil was put into a quartz tube and a heat treatment was performed with hydrogen (99.999%) at 1005° C. and then a high-purity methane gas (99.999%) was injected therein to grow graphene on the copper foil.

Then, a solution in which polymethyl methacrylate (PMMA) was dissolved in toluene at a concentration of 5 mass % was spin-coated on the copper foil on which the graphene was formed to form a PMMA layer.

Then, the PMMA layer was immersed in a copper etchant solution to remove the copper foil, and the remaining cooper etchant solution was removed by washing with distilled water three times.

After the graphene provided on the PMMA layer was transferred onto an $SiO_2$ substrate, it was annealed in a dry oven at a temperature of 80° C.

Then, the PMMA layer was removed using acetone to obtain graphene (PMMA) transferred onto the $SiO_2$ substrate.

Comparative Example 2

Firstly, a copper foil (25 μm, 99.9%, Alfa Aesar) was sequentially washed with Ni etchant (CE-100) and distilled water and a nitrogen gas was used to remove moisture from the copper foil. The copper foil was put into a quartz tube and a heat treatment was performed with hydrogen (99.999%) at 1005° C. and then a high-purity methane gas (99.999%) was injected therein to grow graphene on the copper foil.

Then, a solution in which polystyrene (PS) was dissolved in toluene at a concentration of 5 mass % was spin-coated on the copper foil on which the graphene was formed to form a PS layer.

Then, the PS layer was immersed in a copper etchant solution to remove the copper foil, and the remaining cooper etchant solution was removed by washing with distilled water three times.

After the graphene provided on the PS layer was transferred onto an $SiO_2$ substrate, it was annealed in a dry oven at a temperature of 80° C.

Then, the PS layer was removed using tetrahydrofuran and acetone to obtain graphene (PS) transferred onto the $SiO_2$ substrate.

Test Example

Figure 2:
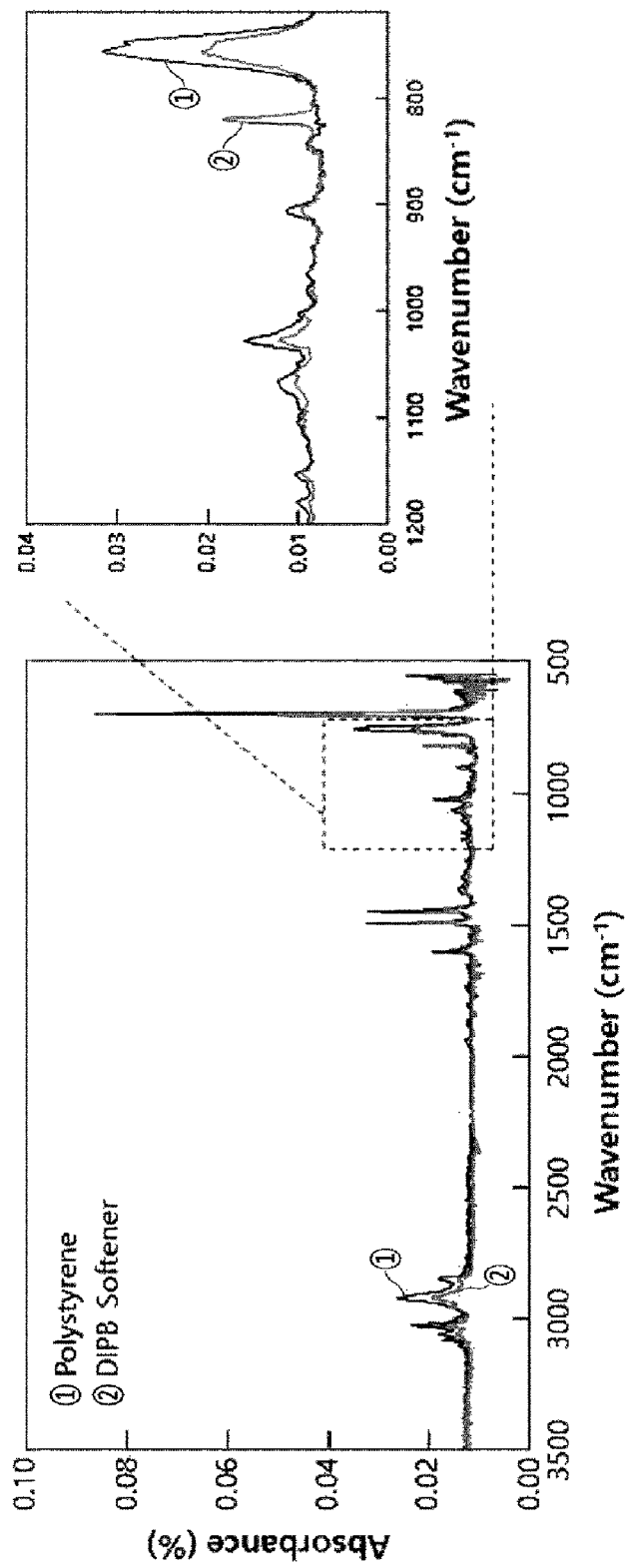
FIG. 2 is an FT-IR (Fourier-transform infrared spectroscopy) graph of a polymer for transferring graphene according to an example of the present disclosure and polystyrene as a comparative example.
Figure 3:
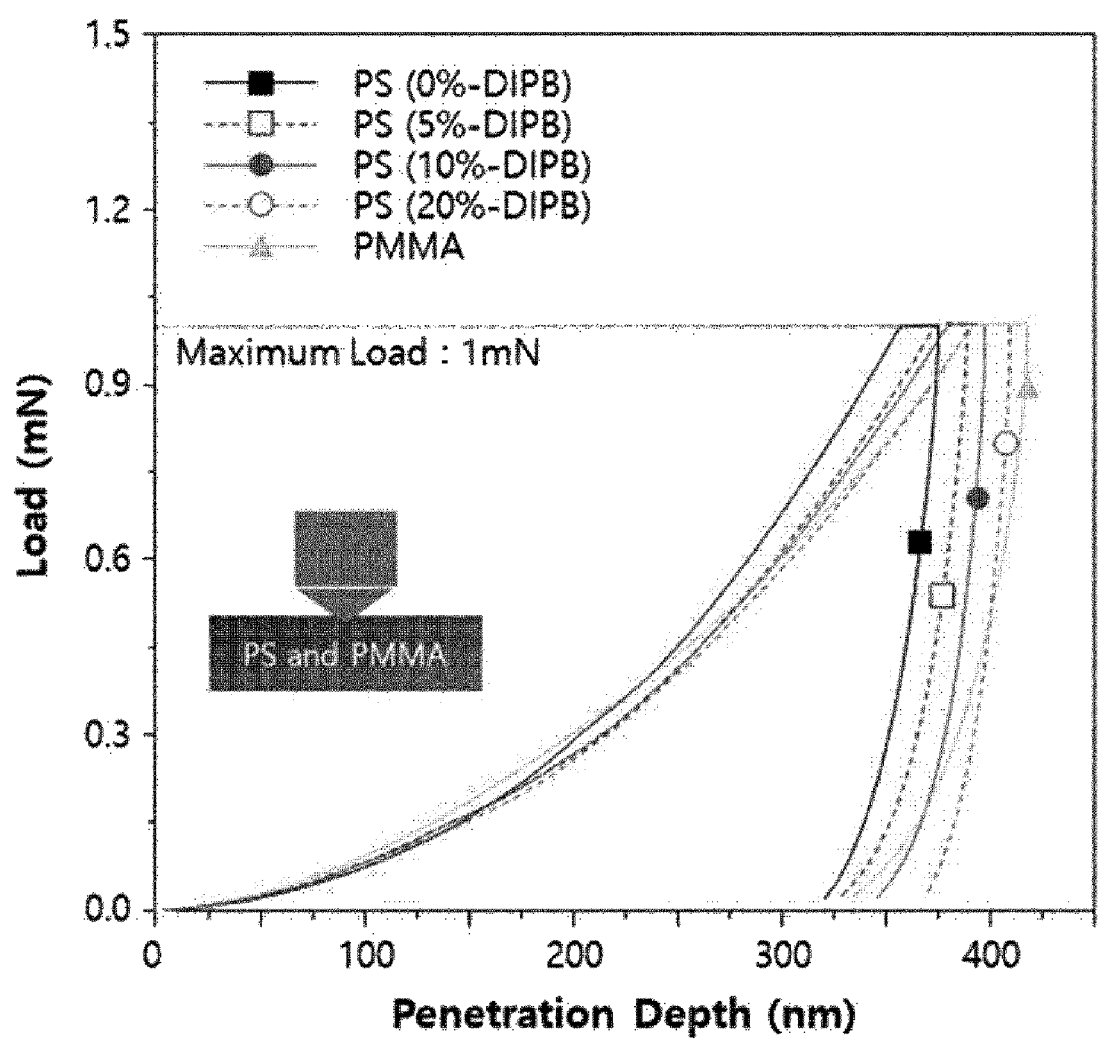
FIG. 3 shows nanoindenter test results of a polymer for transferring graphene according to an example of the present disclosure and PMMA as a comparative example.
Figure 4:
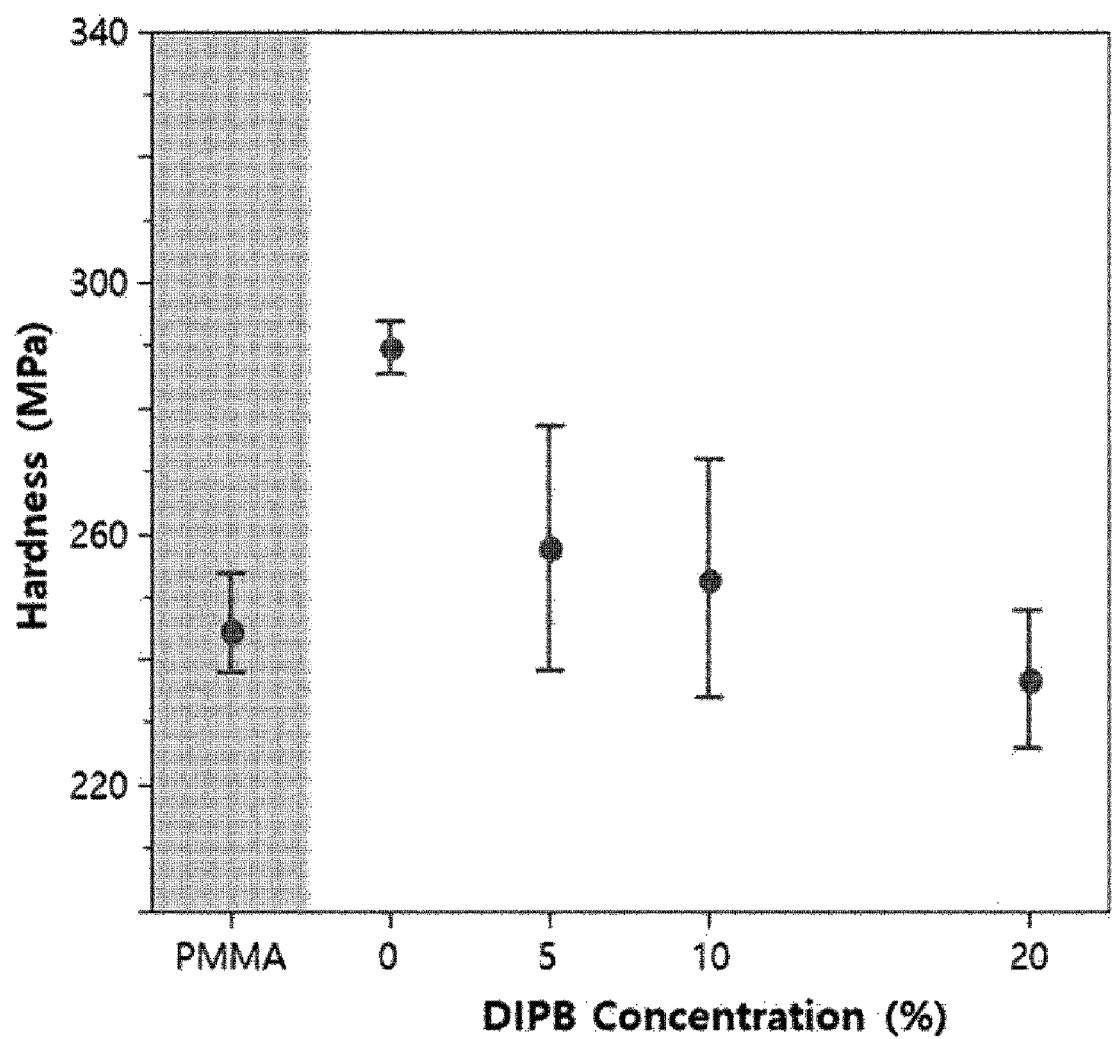
FIG. 4 shows nanoindenter test results of a polymer for transferring graphene according to an example of the present disclosure and PMMA as a comparative example.

The properties of the polymer for transferring graphene as prepared in Example 1 were checked, and a result thereof was shown in FIG. 2 through FIG. 4.

FIG. 2 is an FT-IR (Fourier-transform infrared spectroscopy) graph of a polymer for transferring graphene according to an example of the present disclosure and polystyrene as a comparative example.

According to the result shown in FIG. 2, the polymer for transferring graphene as prepared in Example 1 showed a peak of para-disubstituted benzene at 810 cm$^1$.

FIG. 3 shows nanoindenter test results of a polymer for transferring graphene according to an example of the present disclosure and PMMA as a comparative example.

Specifically, FIG. 3 shows a graph showing a change in load applied to the polymer for transferring graphene and PMMA depending on the content of 4,4'-diisopropylbiphenyl (DIPB).

FIG. 4 shows nanoindenter test results of a polymer for transferring graphene according to an example of the present disclosure and PMMA as a comparative example.

Specifically, FIG. 4 shows a graph showing the hardness of the polymer for transferring graphene depending on the content of 4,4'-diisopropylbiphenyl (DIPB), as compared with PMMA as a comparative example.

Referring to FIG. 3 and FIG. 4, it can be seen that as the content of the DIPB increases, the flexibility of the polymer for transferring graphene increases to be similar to or higher than the flexibility of the PMMA.

The properties of the graphene transferred on the $SiO_2$ substrate as prepared in Example 2 were checked, and a result thereof was shown in FIG. 5 through FIG. 7.

Figure 5A:
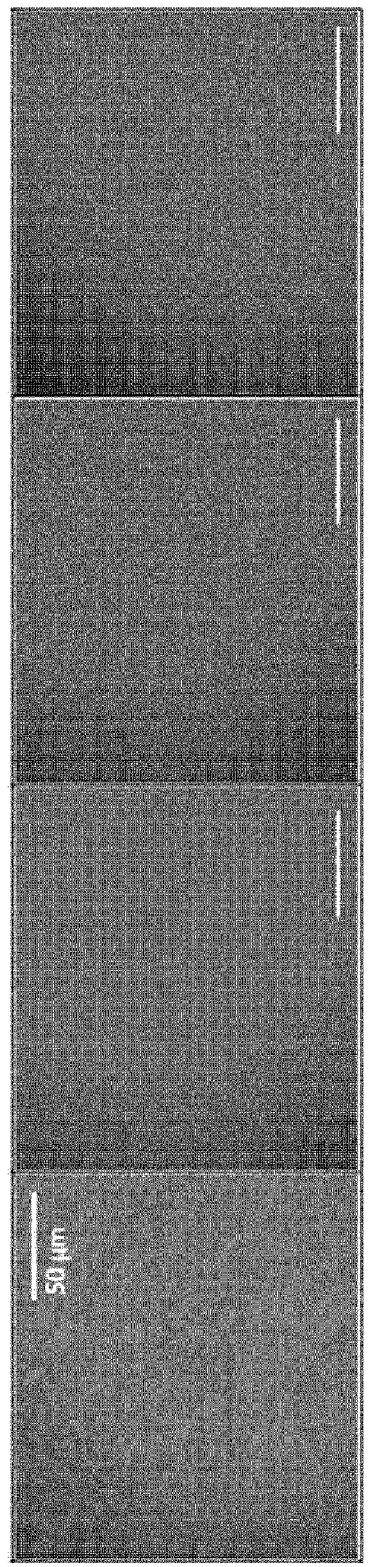
FIG. 5A shows optical microscope (KH-8700 HIROX) images of graphene (a polymer for transferring graphene) transferred onto an $SiO_2$ substrate according to an example of the present disclosure.
Figure 5B:
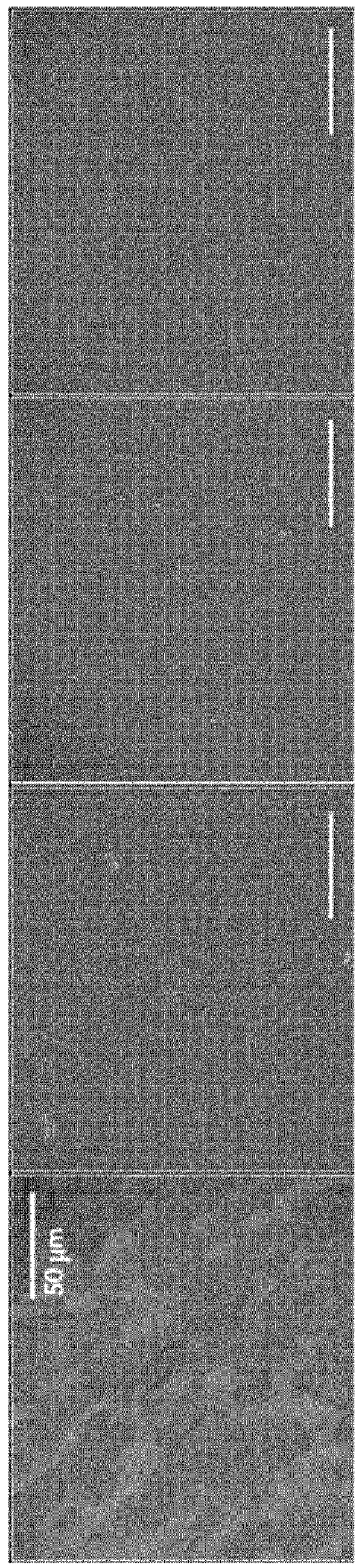
FIG. 5B shows optical microscope images of graphene (PS) transferred onto an $SiO_2$ substrate according to a comparative example.

FIG. 5A shows optical microscope (KH-8700 HIROX) images of graphene (a polymer for transferring graphene) transferred onto an $SiO_2$ substrate according to an example of the present disclosure, and FIG. 5B shows optical microscope images of graphene (PS) transferred onto an $SiO_2$ substrate according to a comparative example.

According to the result shown in FIG. 5, it could be seen that the surface of the graphene transferred using the PS transfer layer prepared in Comparative Example was uneven due to contamination, tearing, or the like, whereas the surface of the graphene transferred using the polymer transfer layer for transferring graphene prepared in Example was clean without any residue.

Therefore, when the polymer for transferring graphene is used, graphene can be transferred to another substrate without contamination nor residues.

Figure 6A:
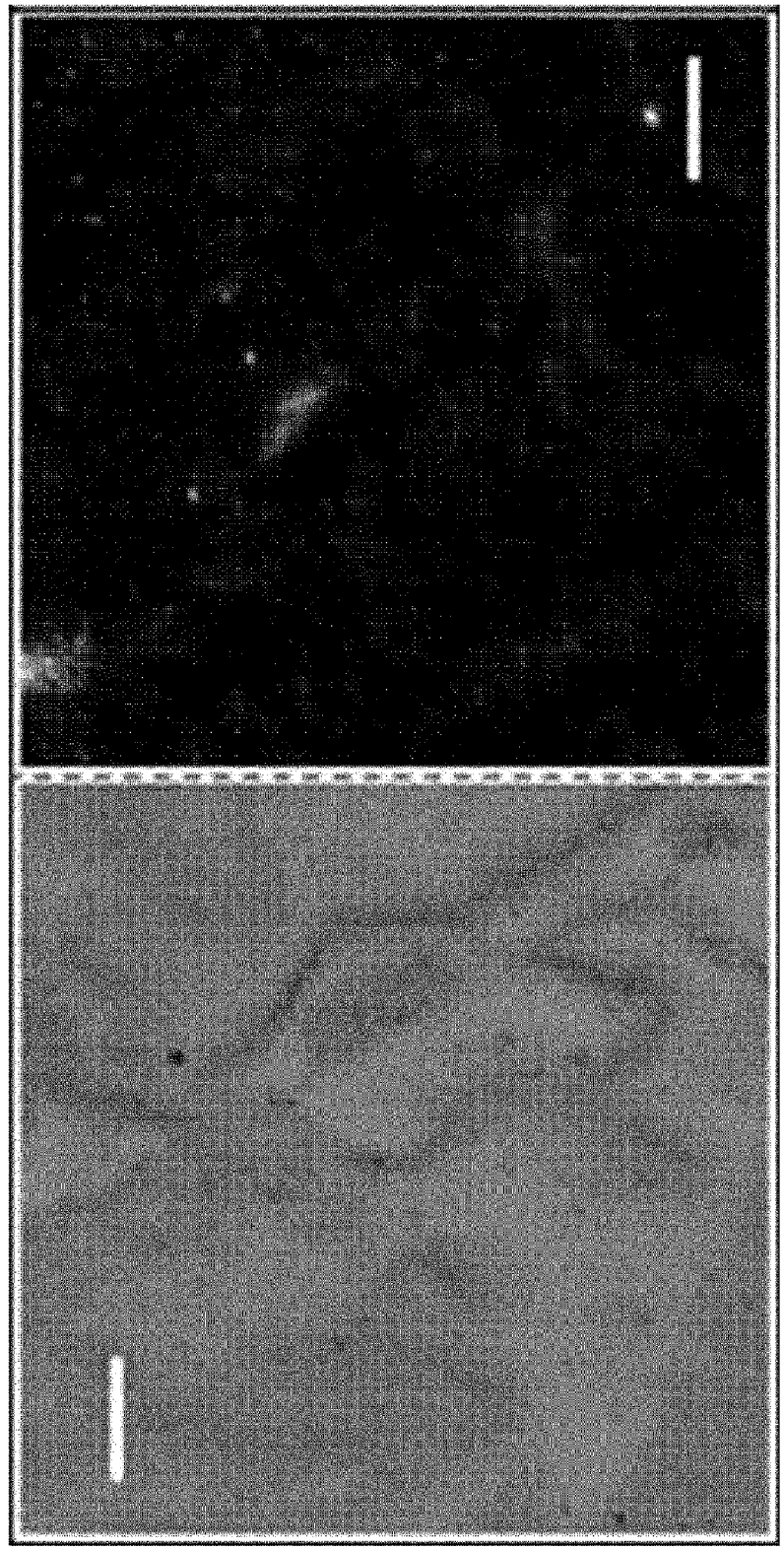
FIG. 6A shows optical microscope images of a polymer for transferring graphene formed on graphene grown on a copper foil according to an example of the present disclosure.
Figure 6B:
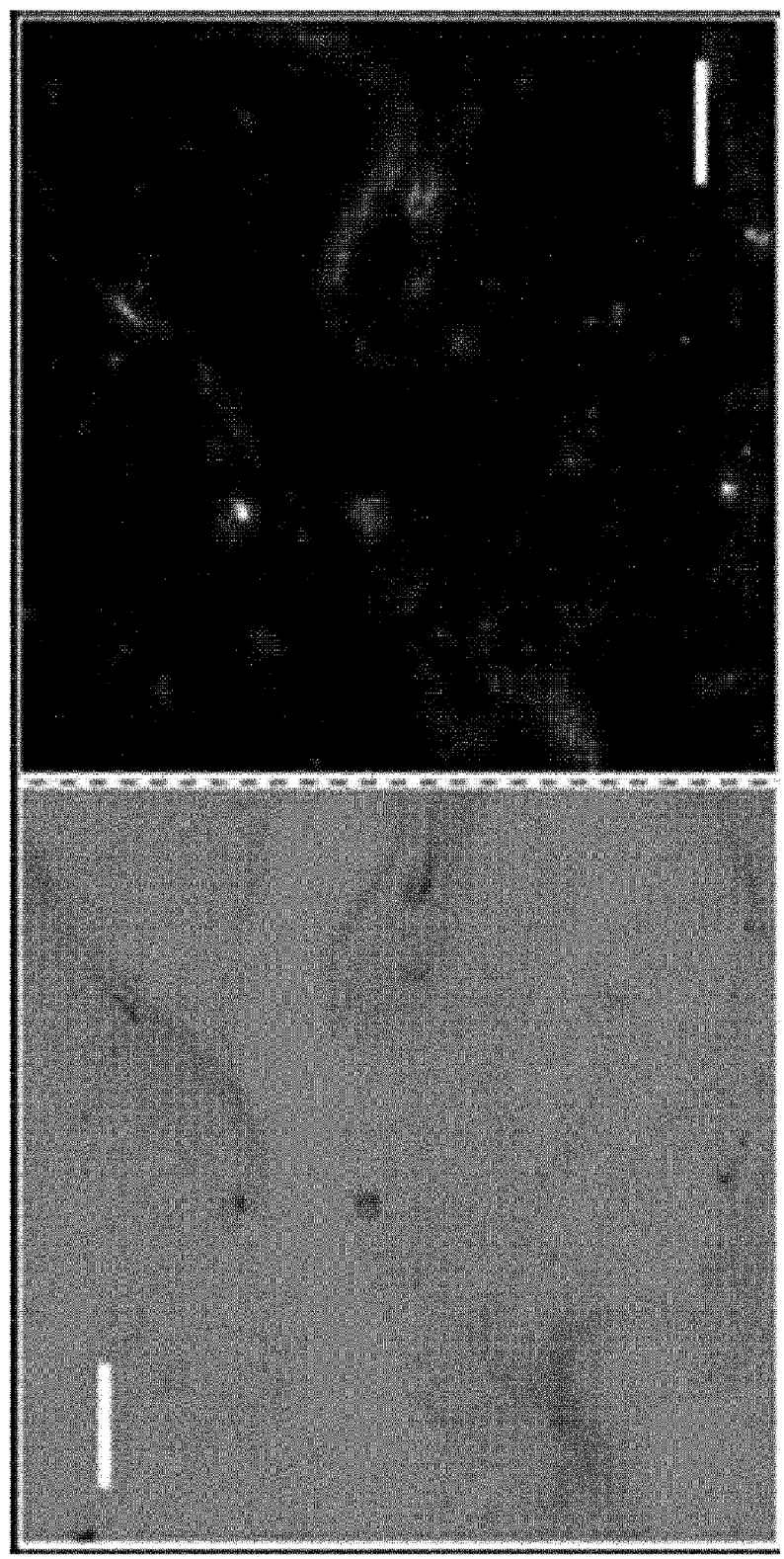
FIG. 6B shows optical microscope images of PS formed on graphene grown on a copper foil according to a comparative example.
Figure 6C:
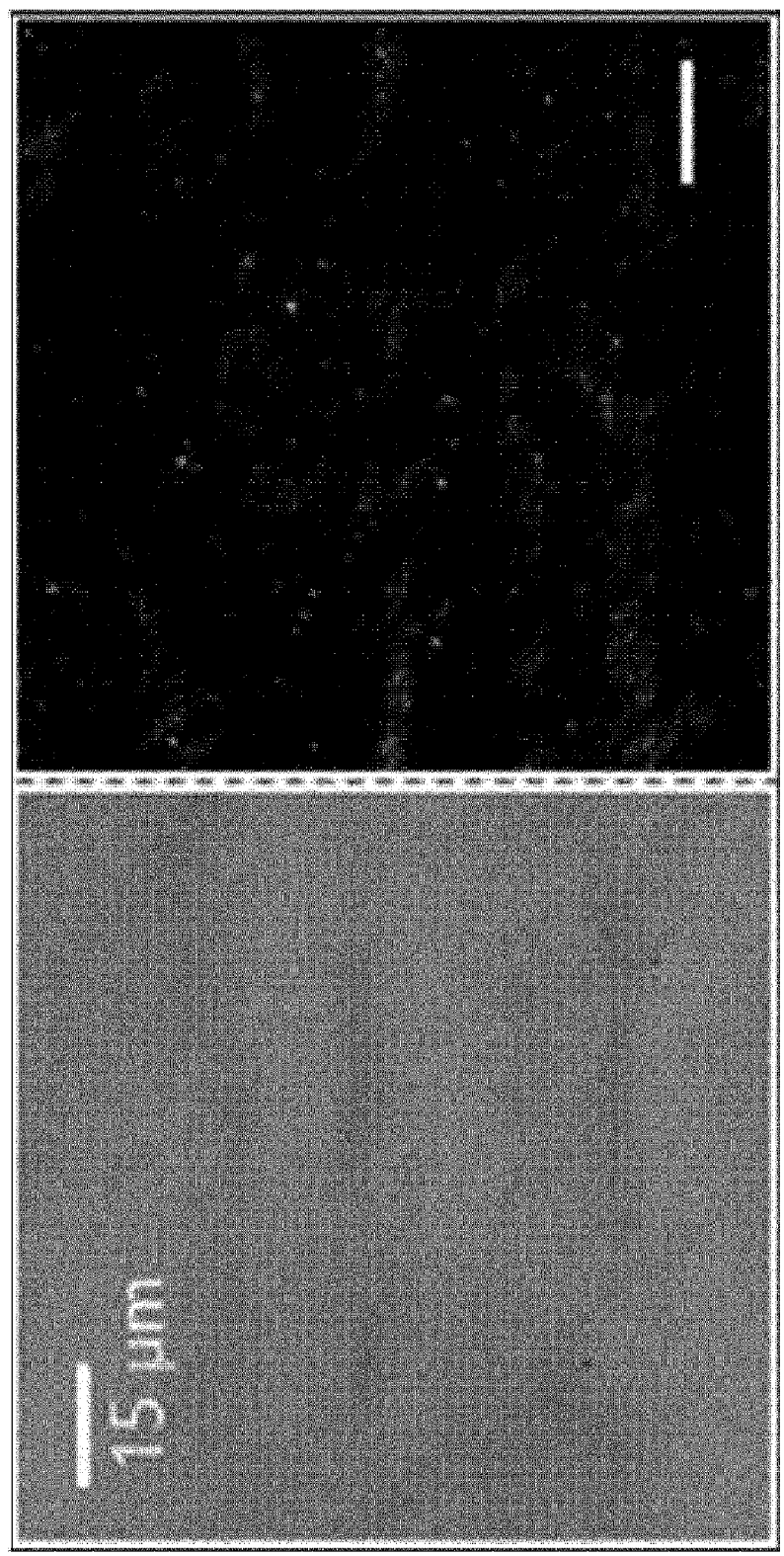
FIG. 6C shows optical microscope images of PMMA formed on graphene grown on a copper foil according to another comparative example.

FIG. 6A shows optical microscope images of a polymer for transferring graphene formed on graphene grown on a copper foil according to an example of the present disclosure, FIG. 6B shows optical microscope images of PS formed on graphene grown on a copper foil according to a comparative example, and FIG. 6C shows optical microscope images of PMMA formed on graphene grown on a copper foil according to another comparative example.

Figure 7A:
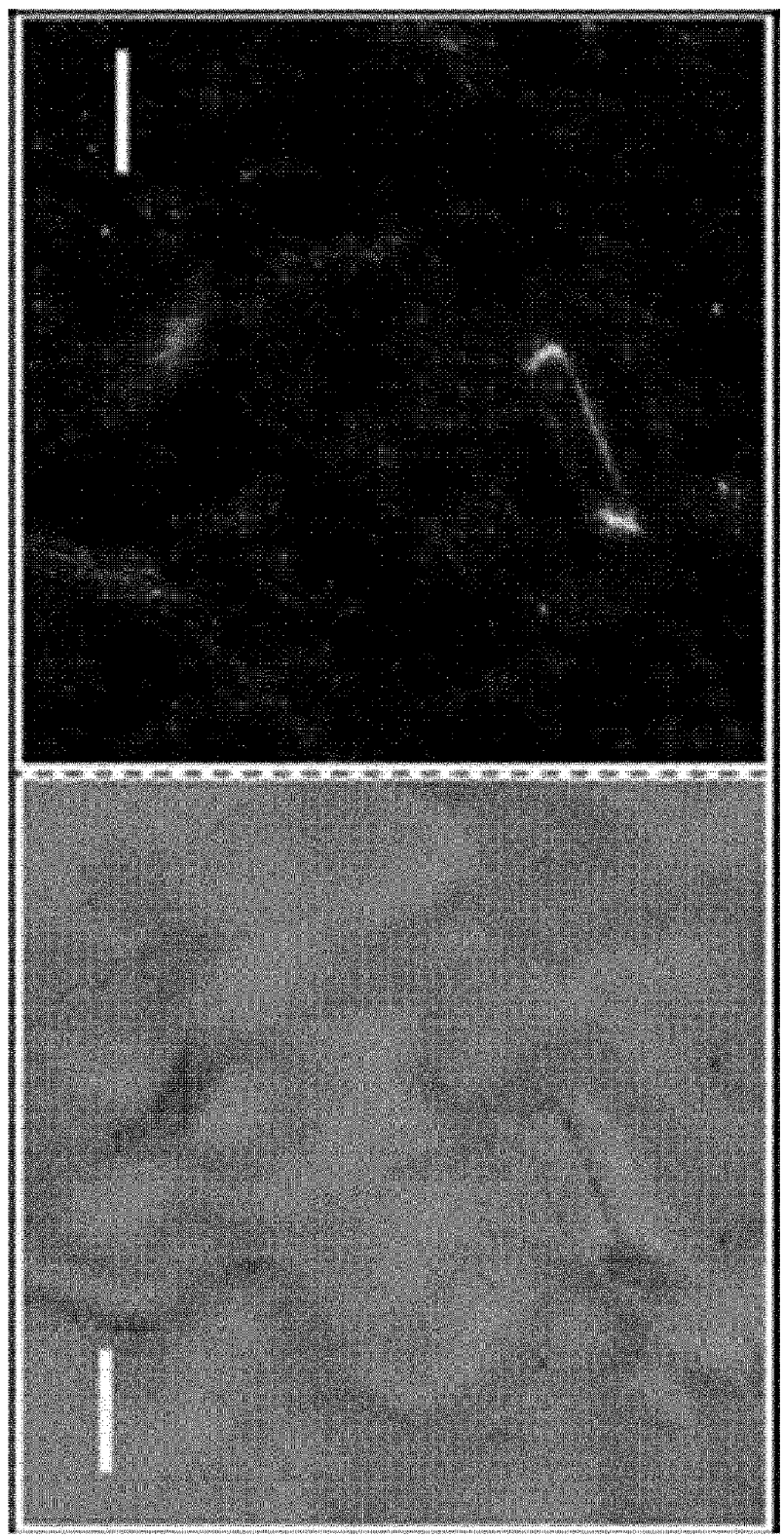
FIG. 7A shows optical microscope images of a bent polymer for transferring graphene formed on graphene grown on a copper foil according to an example of the present disclosure.
Figure 7B:
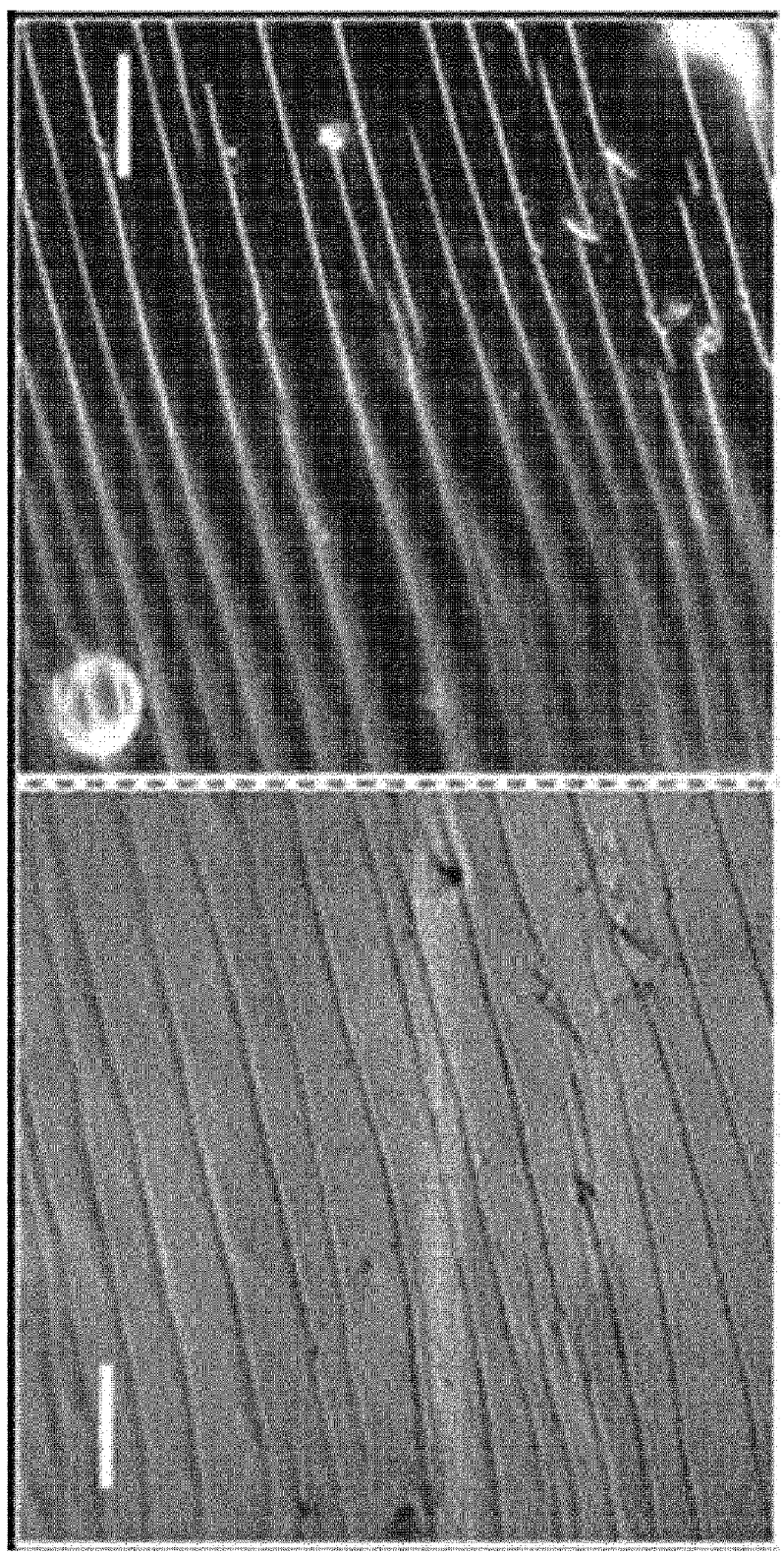
FIG. 7B shows optical microscope images of bent PS formed on graphene grown on a copper foil according to a comparative example.
Figure 7C:
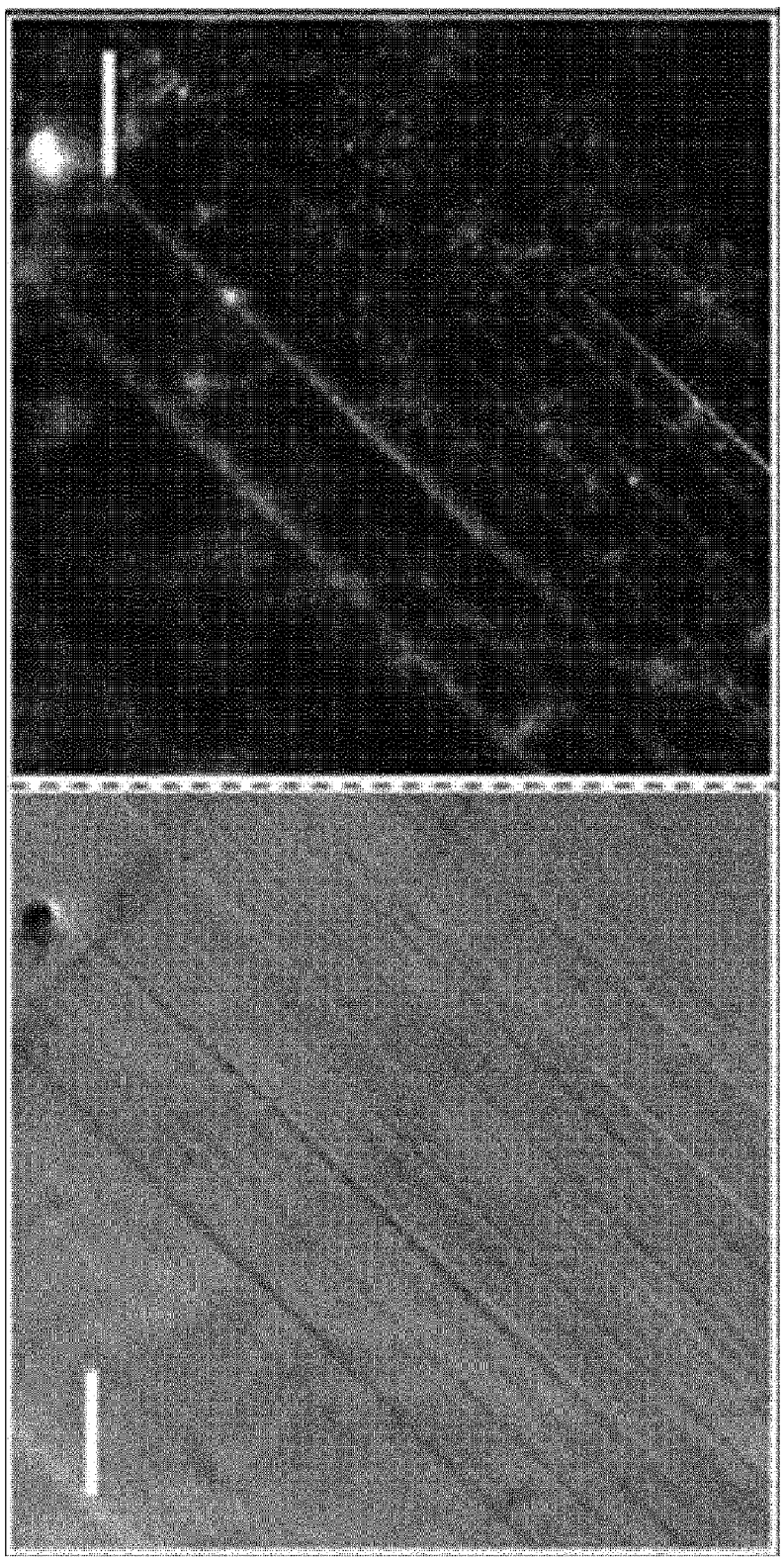
FIG. 7C shows optical microscope images of bent PMMA formed on graphene grown on a copper foil according to another comparative example.

FIG. 7A shows optical microscope images of a bent polymer for transferring graphene formed on graphene grown on a copper foil according to an example of the present disclosure, FIG. 7B shows optical microscope images of bent PS formed on graphene grown on a copper foil according to a comparative example, and FIG. 7C shows optical microscope images of bent PMMA formed on graphene grown on a copper foil according to another comparative example.

Figure 8A:
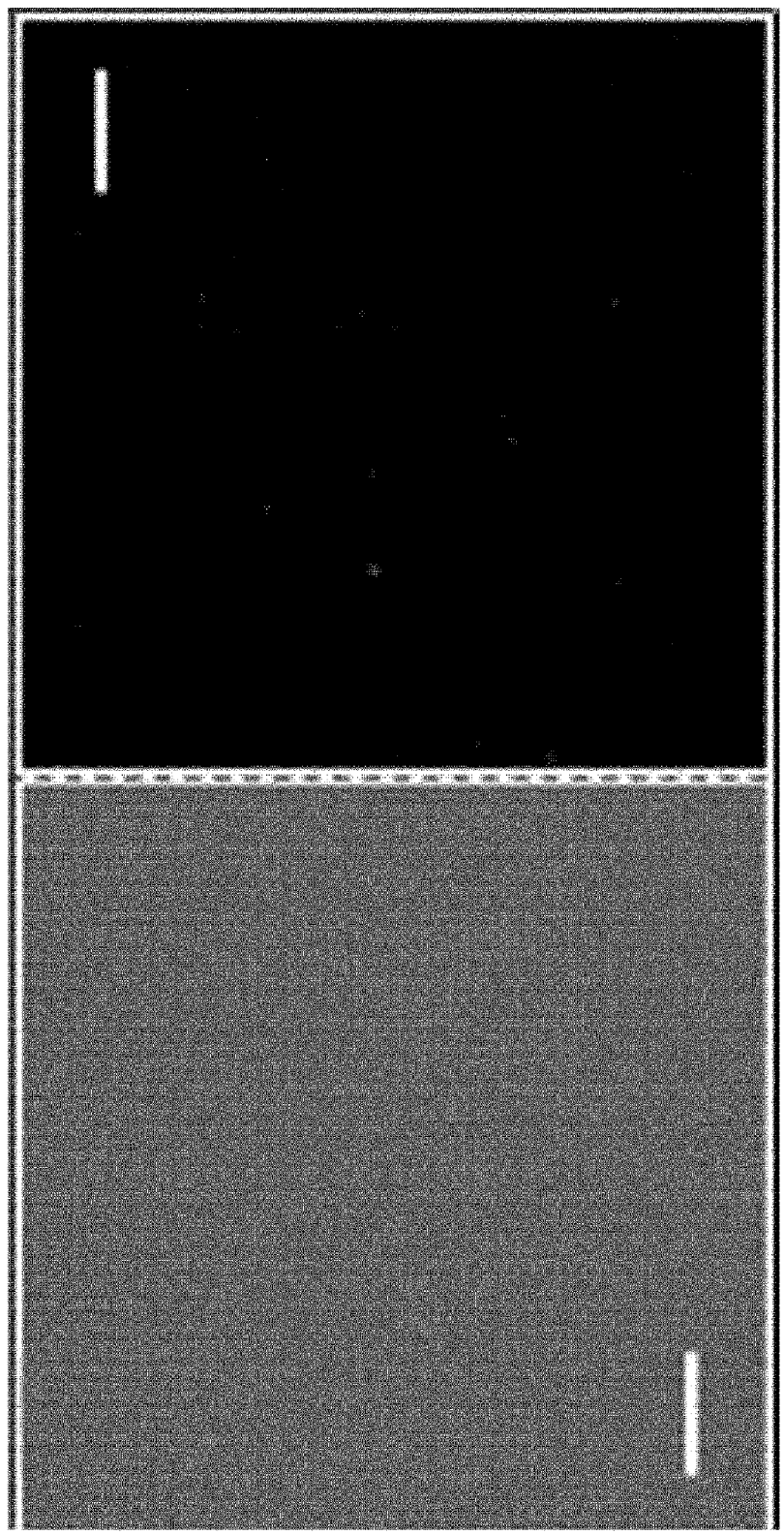
FIG. 8A shows optical microscope images of bent graphene (a polymer for transferring graphene) transferred onto an $SiO_2$ substrate according to an example of the present disclosure.
Figure 8B:
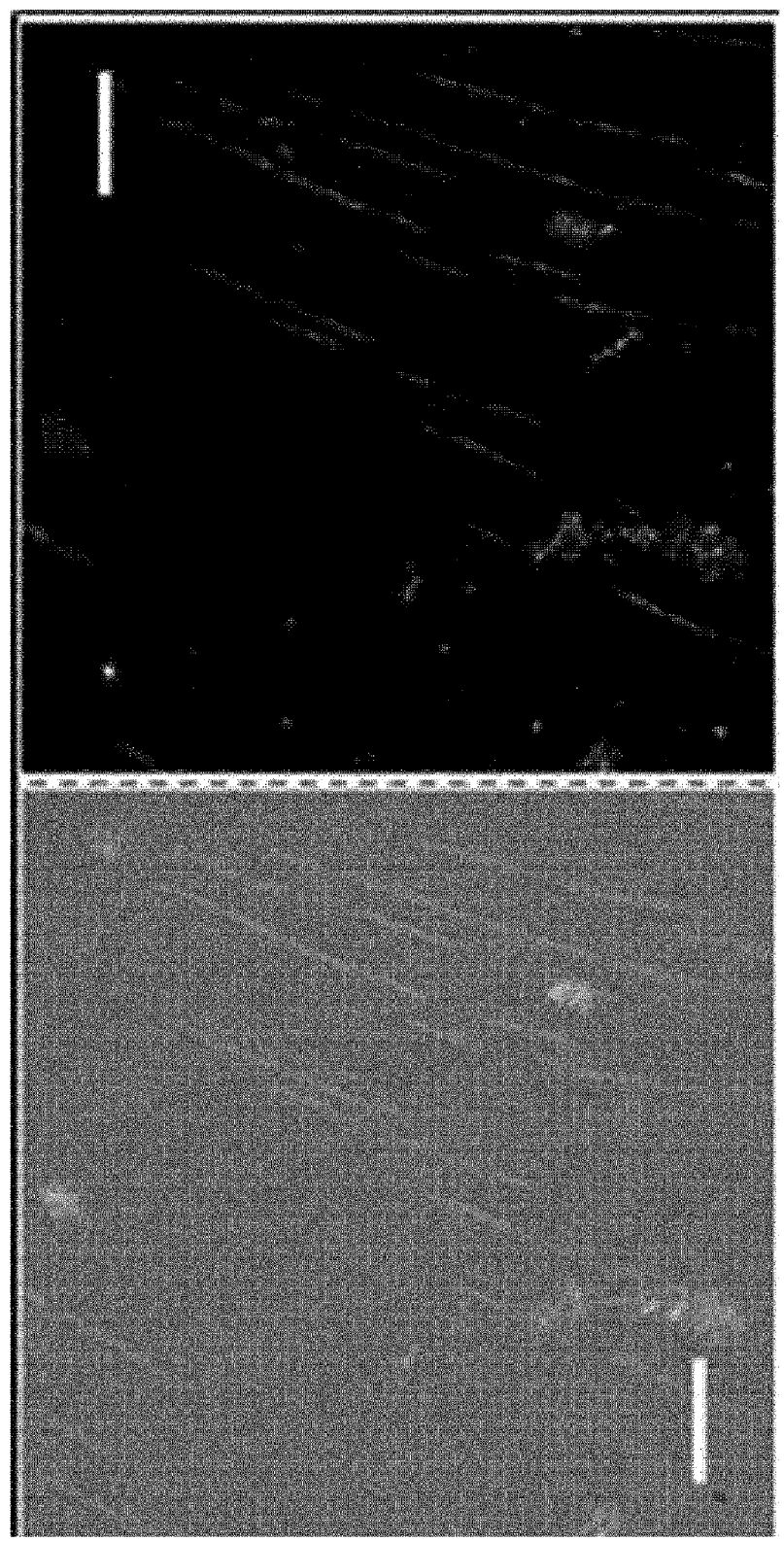
FIG. 8B shows optical microscope images of bent graphene (PS) transferred onto an $SiO_2$ substrate according to a comparative example.
Figure 8C:
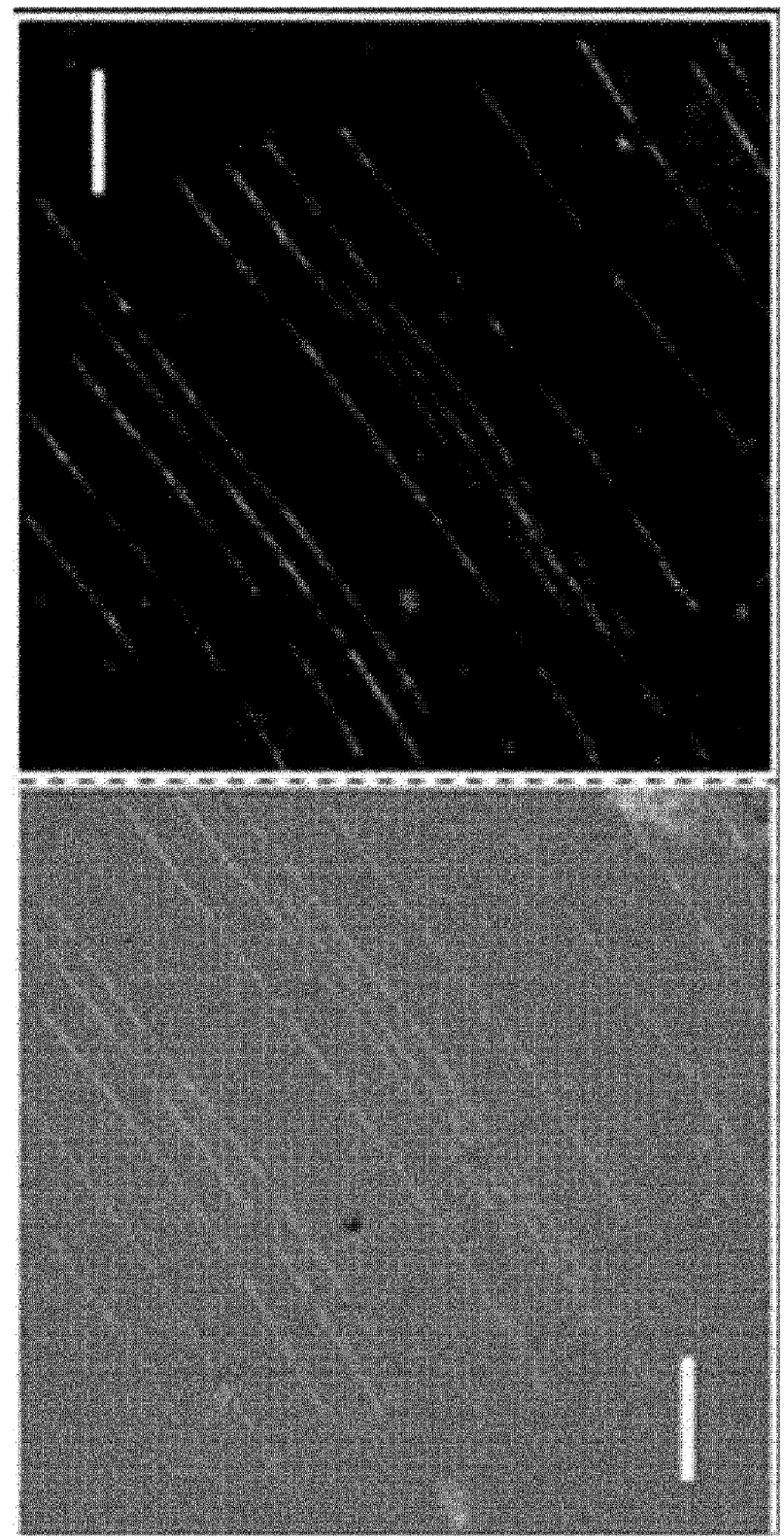
FIG. 8C shows optical microscope images of bent graphene (PMMA) transferred onto an $SiO_2$ substrate according to another comparative example.

FIG. 8A shows optical microscope images of bent graphene (a polymer for transferring graphene) transferred onto an $SiO_2$ substrate according to an example of the present disclosure, FIG. 8B shows optical microscope images of bent graphene (PS) transferred onto an $SiO_2$ substrate according to a comparative example, and FIG. 8C shows optical microscope images of bent graphene (PMMA) transferred onto an $SiO_2$ substrate according to another comparative example.

Figure 9A:
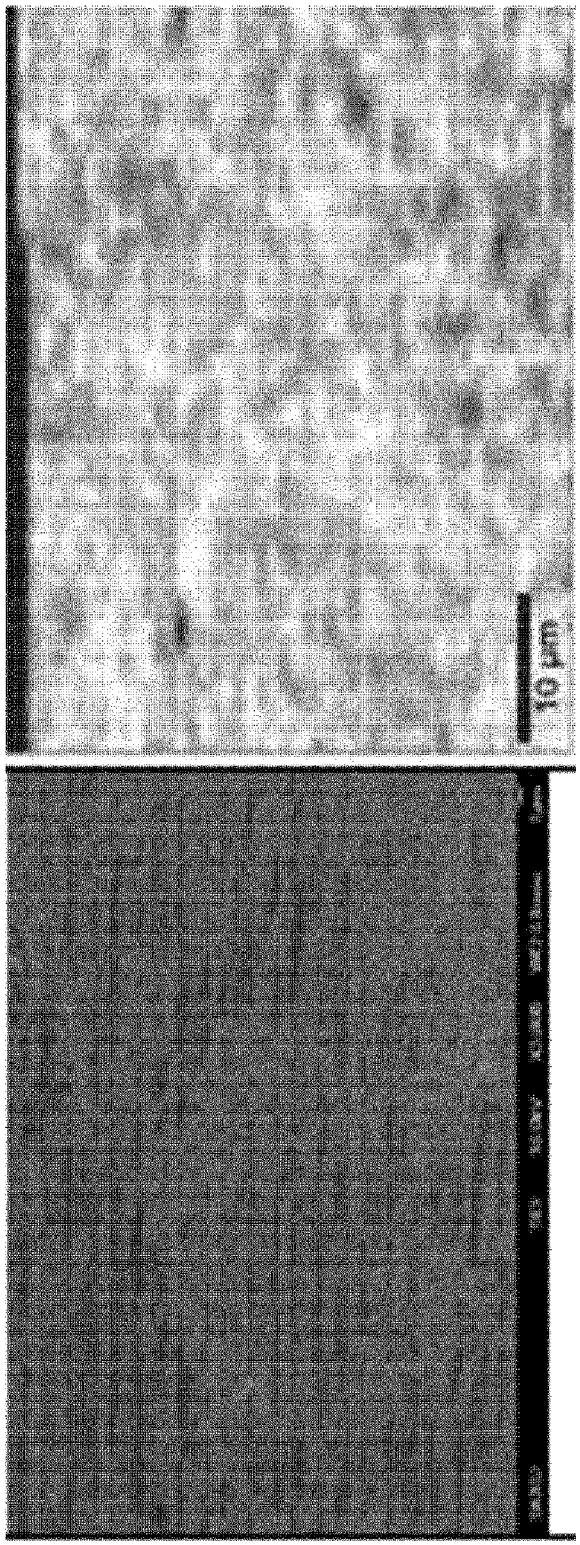
FIG. 9A shows an SEM (scanning electron microscope) image and a Raman mapping image of graphene (a polymer for transferring graphene) transferred onto an $SiO_2$ substrate according to an example of the present disclosure.
Figure 9B:
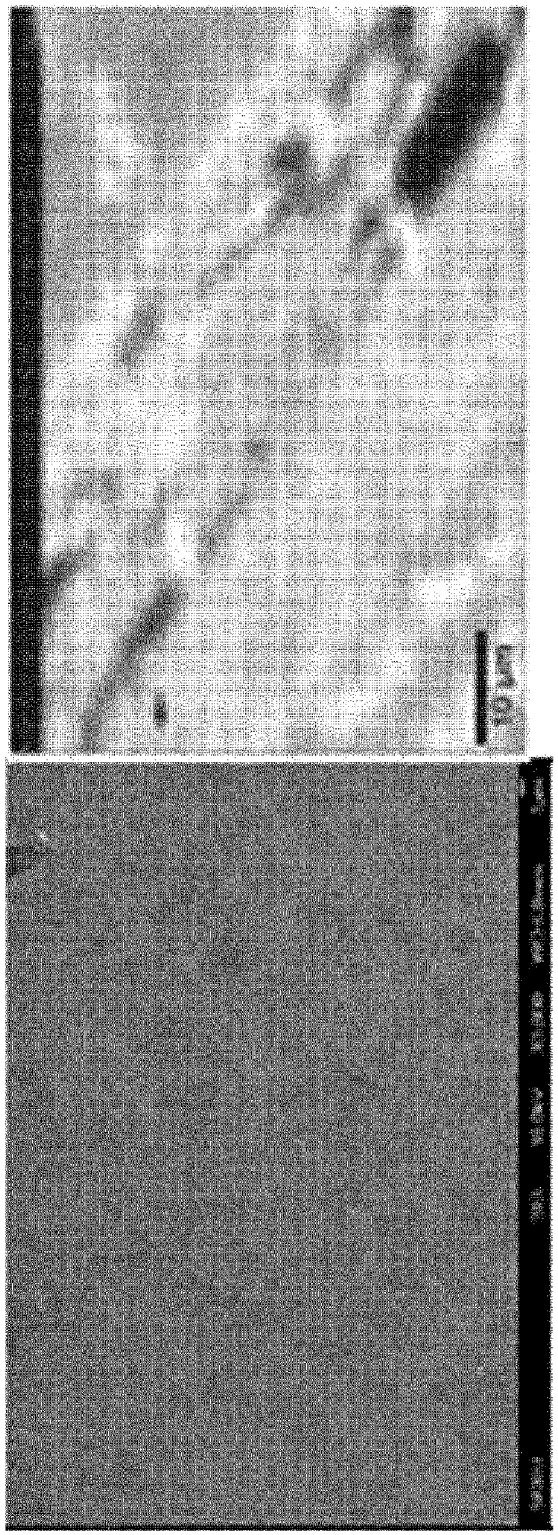
FIG. 9B shows an SEM image and a Raman mapping image of graphene (PS) transferred onto an $SiO_2$ substrate according to a comparative example.
Figure 9C:
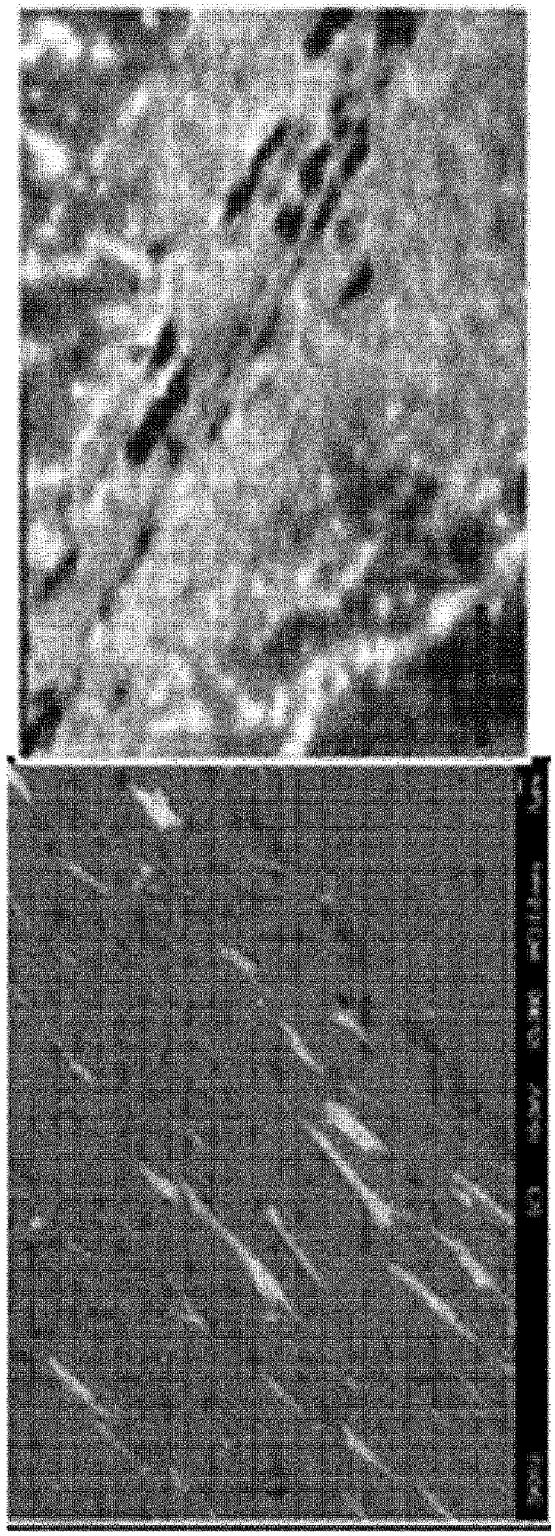
FIG. 9C shows an SEM image and a Raman mapping image of graphene (PMMA) transferred onto an $SiO_2$ substrate according to another comparative example.

FIG. 9A shows an SEM (scanning electron microscope) image and a Raman mapping image of graphene (a polymer for transferring graphene) transferred onto an $SiO_2$ substrate according to an example of the present disclosure, FIG. 9B shows an SEM image and a Raman mapping image of graphene (PS) transferred onto an $SiO_2$ substrate according to a comparative example, and FIG. 9C shows an SEM image and a Raman mapping image of graphene (PMMA) transferred onto an $SiO_2$ substrate according to another comparative example.

According to the results shown in FIG. 6 through FIG. 9, the graphene transferred using PMMA showed most cracks after bending and the graphene transferred using PS showed cracks fewer than the case using PMMA. However, it could be seen that the surface of the graphene transferred using the polymer for transferring graphene did not show any crack even after bending, and, thus, graphene could be easily transferred to a flexible substrate.

The above description of the present disclosure is provided for the purpose of illustration, and it would be understood by a person with ordinary skill in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A transfer method of graphene, the method comprising:
forming graphene on a first substrate;
forming a polymer for transferring graphene on the graphene;
removing the first substrate;
transferring the graphene, which is provided on the polymer for transferring graphene, onto a second substrate; and
removing the polymer for transferring graphene,
wherein the forming of the polymer for transferring graphene, comprises:
preparing a polystyrene solution by mixing polystyrene with a solvent; and
adding a softener to the polystyrene solution to prepare a polymer solution,
wherein the softener is different than the solvent and comprises a compound represented by the following Chemical Formula 1:

[Chemical Formula 1]

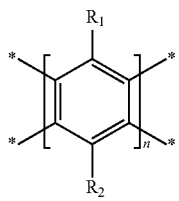

(in Chemical Formula 1, $R_1$ and $R_2$ are each independently selected from the group consisting of H, linear or branched $C_1$-$C_{20}$ alkyl, which can be substituted, and $C_6$-$C_{20}$ aryl, which can be substituted, and the substitution is carried out with $C_1$-$C_6$ alkyl or $C_6$-$C_{20}$ aryl, and n is 1 to 10), wherein the compound represented by the Chemical Formula 1 includes a compound containing a substituent and selected from the group consisting of biphenyl, naphthalene, fluorene, anthracene, phenanthrene, pyrene, fluoranthene, chrysene, benzofluoranthene, perylene, quinoline, indenoanthracene, picene, indenophenanthrene, hydroanthracene, dibenzothiophene, dibenzofuran, and combinations thereof, and wherein the compound represented by the Chemical Formula 1 is contained in the amount of from 6 parts by weight to 29 parts by weight based on 100 parts by weight of the polymer for transferring graphene.

2. The transfer method of graphene of claim 1, wherein the forming of the polymer for transferring graphene on the graphene comprises coating the polymer solution on the graphene.

3. The transfer method of graphene of claim 2, wherein the solvent includes a solvent selected from the group consisting of toluene, heptane, carbon tetrachloride, benzene, xylene, N-methylpyrrolidone, tetrahydrofuran, nitrobenzene, N,N-dimethylformamide, dimethylsulfoxide, diethylcarbonate, benzyl acetate, dimethyl glutarate, ethyl acetoacetate, isobutyl isobutanoate, isobutyl acetate, meta-cresol, and combinations thereof.

4. The transfer method of graphene of claim 1, wherein the first substrate and the second substrate contain each independently a material selected from the group consisting of a metal substrate, a plastic substrate, a glass substrate, a silicon substrate, a sapphire substrate, a nitride substrate, a conductive substrate, and combinations thereof.

5. The transfer method of graphene of claim 2, wherein the coating is performed by a coating method selected from the group consisting of spin coating, spray coating, doctor blade coating, screen printing, dip coating, casting, Langmuir-Blodgett (LB) deposition, ink-jet printing, nozzle printing, slot die coating, gravure printing, and combinations thereof.

6. The transfer method of graphene of claim 1, wherein the forming of the graphene on the first substrate comprises:
performing a heat treatment with a carbon source being supplied onto the first substrate to grow the graphene.

7. The transfer method of graphene of claim 6, wherein the carbon source contains a carbon-containing compound having 1 to 7 carbon atoms.

8. The transfer method of graphene of claim 7, wherein the carbon source includes a material selected from the group consisting of methane, ethane, ethylene, carbon monoxide, ethanol, acetylene, propane, propylene, butane, butadiene, pentane, pentene, cyclopentadiene, hexane, cyclohexane, benzene, toluene, and combinations thereof.

* * * * *